US009368671B2

(12) United States Patent
Wojtczuk et al.

(10) Patent No.: US 9,368,671 B2
(45) Date of Patent: Jun. 14, 2016

(54) BIFACIAL TANDEM SOLAR CELLS

(71) Applicant: MASIMO SEMICONDUCTOR, INC., Irvine, CA (US)

(72) Inventors: Steven J. Wojtczuk, Lexington, MA (US); Philip T. Chiu, Arlington, MA (US); Xuebing Zhang, Acton, MA (US); Edward Gagnon, Bedford, MA (US); Michael Timmons, Durham, NC (US)

(73) Assignee: MASIMO SEMICONDUCTOR, INC., Irvine, CA (US)

( * ) Notice: Subject to any disclaimer, the term of this patent is extended or adjusted under 35 U.S.C. 154(b) by 0 days.

(21) Appl. No.: 14/507,607

(22) Filed: Oct. 6, 2014

(65) Prior Publication Data

US 2015/0099324 A1    Apr. 9, 2015

Related U.S. Application Data

(63) Continuation of application No. 12/800,824, filed on May 24, 2010, now Pat. No. 8,852,994.

(51) Int. Cl.

| H01L 31/00 | (2006.01) |
|---|---|
| H01L 31/18 | (2006.01) |
| H01L 31/068 | (2012.01) |
| H01L 31/0687 | (2012.01) |
| H01L 31/0693 | (2012.01) |

(52) U.S. Cl.
CPC ........ H01L 31/1844 (2013.01); H01L 31/0684 (2013.01); H01L 31/0687 (2013.01); H01L 31/0693 (2013.01); Y02E 10/544 (2013.01); Y02E 10/547 (2013.01)

(58) Field of Classification Search
CPC .................................................. H01L 31/1844
USPC ........................................................... 257/53
See application file for complete search history.

(56) References Cited

U.S. PATENT DOCUMENTS

| 4,094,704 A | 6/1978 | Milnes |
| 4,289,920 A | 9/1981 | Hovel |
| 4,301,321 A | 11/1981 | Bartels |
| 4,385,430 A | 5/1983 | Bartels |
| 4,561,541 A | 12/1985 | Lawrence |

(Continued)

OTHER PUBLICATIONS

Barnett, A. et al. "50% Efficient Solar Cell Architectures and Designs", Conference Record of the 2006 IEEE 4th World Conference on Photovoltaic Energy Conversion, vol. 2, May 2006 pp. 2560-2564.

(Continued)

*Primary Examiner* — Matthew Landau
*Assistant Examiner* — Igwe U Anya
(74) *Attorney, Agent, or Firm* — Knobbe, Martens, Olson & Bear LLP

(57) ABSTRACT

A method of fabricating on a semiconductor substrate bifacial tandem solar cells with semiconductor subcells having a lower bandgap than the substrate bandgap on one side of the substrate and with subcells having a higher bandgap than the substrate on the other including, first, growing a lower bandgap subcell on one substrate side that uses only the same periodic table group V material in the dislocation-reducing grading layers and bottom subcells as is present in the substrate and after the initial growth is complete and then flipping the substrate and growing the higher bandgap subcells on the opposite substrate side which can be of different group V material.

16 Claims, 3 Drawing Sheets

(56) References Cited

U.S. PATENT DOCUMENTS

| | | | |
|---|---|---|---|
| 4,698,455 | A | 10/1987 | Cavicchi et al. |
| 4,703,553 | A | 11/1987 | Mardesich |
| 4,710,254 | A | 12/1987 | Garlick |
| 4,795,501 | A | 1/1989 | Stanbery |
| 4,829,269 | A | 5/1989 | Minahan |
| 4,838,952 | A | 6/1989 | Dill et al. |
| H667 | H | 9/1989 | Bedair et al. |
| 4,963,949 | A | 10/1990 | Wanlass et al. |
| 5,019,177 | A | 5/1991 | Wanlass et al. |
| 5,034,068 | A | 7/1991 | Glenn et al. |
| 5,080,504 | A | 1/1992 | Partain et al. |
| 5,091,018 | A | 2/1992 | Fraas et al. |
| 5,100,808 | A | 3/1992 | Glenn |
| 5,223,043 | A * | 6/1993 | Olson et al. ............ 136/249 |
| 5,322,572 | A | 6/1994 | Wanlass |
| 5,330,585 | A | 7/1994 | Chang et al. |
| 5,391,236 | A | 2/1995 | Krut et al. |
| 5,420,043 | A | 5/1995 | Niwa |
| 5,425,816 | A | 6/1995 | Cavicchi et al. |
| 5,460,659 | A | 10/1995 | Krut |
| 5,508,206 | A | 4/1996 | Glenn et al. |
| 6,150,603 | A | 11/2000 | Karam et al. |
| 6,255,580 | B1 | 7/2001 | Karam et al. |
| 6,281,426 | B1 | 8/2001 | Olson et al. |
| 6,340,788 | B1 | 1/2002 | King et al. |
| 6,380,601 | B1 | 4/2002 | Ermer et al. |
| 6,489,635 | B1 | 12/2002 | Sugg |
| 7,095,050 | B2 | 8/2006 | Wanlass et al. |
| 7,326,970 | B2 | 2/2008 | Kinsey et al. |
| 8,187,907 | B1 | 5/2012 | Newman |
| 8,236,600 | B2 | 8/2012 | Cornfeld |
| 8,877,077 | B2 | 11/2014 | Lichtensteiger |
| 2003/0230761 | A1 | 12/2003 | Morrison et al. |
| 2004/0051165 | A1 | 3/2004 | Boisvert |
| 2004/0079408 | A1* | 4/2004 | Fetzer ............ H01L 31/184 136/262 |
| 2004/0166681 | A1 | 8/2004 | Iles et al. |
| 2004/0200523 | A1 | 10/2004 | King et al. |
| 2004/0209390 | A1 | 10/2004 | Senda et al. |
| 2004/0261838 | A1 | 12/2004 | Cotal et al. |
| 2005/0056312 | A1* | 3/2005 | Young ............ H01L 31/0749 136/258 |
| 2005/0081910 | A1 | 4/2005 | Danielson et al. |
| 2005/0133919 | A1 | 6/2005 | Yoon et al. |
| 2005/0199281 | A1 | 9/2005 | Fatemi et al. |
| 2006/0001118 | A1 | 1/2006 | Boisvert et al. |
| 2006/0045431 | A1 | 3/2006 | Boisvert et al. |
| 2006/0065297 | A1 | 3/2006 | Terakawa |
| 2006/0076049 | A1 | 4/2006 | Cota et al. |
| 2006/0107991 | A1 | 5/2006 | Baba |
| 2006/0144435 | A1* | 7/2006 | Wanlass ............ 136/249 |
| 2006/0144438 | A1 | 7/2006 | Dresselhaus et al. |
| 2006/0162767 | A1 | 7/2006 | Mascarenhas et al. |
| 2006/0162768 | A1* | 7/2006 | Wanlass ............ H01L 31/06875 136/262 |
| 2006/0185582 | A1 | 8/2006 | Atwater et al. |
| 2006/0185725 | A1 | 8/2006 | Fatemi et al. |
| 2006/0202243 | A1 | 9/2006 | Kinsey et al. |
| 2007/0068572 | A1 | 3/2007 | Fetzer et al. |
| 2007/0113884 | A1 | 5/2007 | Kinsey et al. |
| 2007/0131275 | A1 | 6/2007 | Kinsey et al. |
| 2007/0131977 | A1 | 6/2007 | Boisvert et al. |
| 2007/0138636 | A1 | 6/2007 | Yoon et al. |
| 2007/0145507 | A1 | 6/2007 | Basol |
| 2008/0092942 | A1 | 4/2008 | Kinsey et al. |
| 2008/0115823 | A1 | 5/2008 | Kinsey |
| 2008/0121866 | A1 | 5/2008 | Yuan et al. |
| 2008/0127916 | A1 | 6/2008 | Burgess et al. |
| 2008/0308891 | A1 | 12/2008 | Boisvert et al. |
| 2009/0008738 | A1 | 1/2009 | Yuan et al. |
| 2009/0229659 | A1 | 9/2009 | Wanlass et al. |
| 2010/0075175 | A1 | 3/2010 | Poblenz et al. |
| 2010/0186822 | A1 | 7/2010 | Pan et al. |
| 2010/0263707 | A1 | 10/2010 | Cheong et al. |
| 2010/0326518 | A1 | 12/2010 | Juso et al. |
| 2011/0050838 | A1 | 3/2011 | Nagumo |
| 2011/0186117 | A1 | 8/2011 | Kumar et al. |
| 2011/0259936 | A1 | 10/2011 | Lichtensteiger |
| 2011/0287578 | A1 | 11/2011 | Wojtczuk et al. |
| 2011/0290312 | A1 | 12/2011 | Agui et al. |
| 2011/0303268 | A1 | 12/2011 | Tan et al. |
| 2012/0058591 | A1 | 3/2012 | Siskavich |
| 2012/0138130 | A1 | 6/2012 | Guter et al. |
| 2013/0243021 | A1 | 9/2013 | Siskavich |

OTHER PUBLICATIONS

Fahrenbruch, A.L et al. "Fundamentals of Solar Cells", Academic Press, 1983, pp. 83-84.

Ferrini, R. et al., "Optical functions of InGaP/GaAs epitaxial layers from 0.01 to 5.5eV," Eur. Phys. J. B 27, 2002, pp. 449-458.

Green, M.A. "Solar Cells", Prentice-Hall, 1982, pp. 96-97.

Guter, W. et al. "Current-matched triple-junction solar cell reaching 41.1% conversion efficiency under concentrated sunlight", Appl. Phys. Lett., 94, 223504 (2009).

Henry, C.H. "Limiting efficiencies of ideal single and multiple energy gap terrestrial solar cells," J. Appl. Phys. 51(8), 1980, pp. 4494-4500.

King, R. et al. "Pathways to 40% Efficient Concentrator Photovoltaics", 20th European Solar Energy Conf. 2005, pp. 118-123.

King, R.R. et al. "Band-Gap Engineering Architectures for High-Efficiency Multijunction Concentrator Solar Cells," 24th European Photovoltaic Solar Energy Conference, 2009, pp. 55-61.

Kurtz, S.R. et al. "Competing Kinetic and Thermodynamic Processes in the Growth and Ordering of Ga0.5In0.5P," Mat. Res. Soc. Symp. Proc. vol. 312, 1993.

Levi, D.H. et al. "Effects of ordering on the optical properties of GaInP2" Proc. SPIE, vol. 5530, 326 (2004).

Matthews, J.W. et al. "Journal of Crystal Growth 27", 1974, pp. 118.

Olson, J.M. et al. "A 27.3%. Efficient Ga(0.5)In(0.5)P/GaAs Tandem Solar Cell," Appl. Phys. Lett., 56, 1990, pp. 623-625.

Palik, Ed "Handbook of Optical Constants of Solids", Academic Press, 1985, pp. 429-433.

Rosencher, E. et al. "Optoelectronics", Cambridge University Press, 2002, pp. 312-313.

Schultz, J.C. et al. "High Efficiency 1.0eV GaInAs Bottom Solar Cell for 3-Junction Monolithic Stack", Conf. Rec. of 21st IEEE PVSC, 1990, pp. 148-152.

Spitzer, W.G. and Whelan, J. M., Phys. Rev. 114, 1 (1959) pp. 59-63.

Wang S., "Fundamentals of Semiconductor Theory and Device Physics", Prentice-Hall, 1989, pp. 486-492.

Cotal et al., "IV Multijunction Solar Cells for Concentrating Photovoltaics". Energy & Environmental Science. 2009.001: 10.1039/b809257e. Review Article. pp. 1-31.

Geiesz et al., "40.8% efficient inverted triple-junction solar cell with two independently metamorphic junctions". Applied Physics Letters 93. 123505 (2008), 3 pgs. (unnumbered).

Spectralab. Inc., Photovoltaic Products. 28.3% Ultra Triple Junction (UT J) Solar Cells. Spectralab. Inc., 12500 Gladstone Avenue, Sylmar, California 91342 USA 2 data sheets (unnumbered).

U.S. Appl. No. 13/892,051, filed May 10, 2013, Epitaxial Structures on Sides of a Substrate.

\* cited by examiner

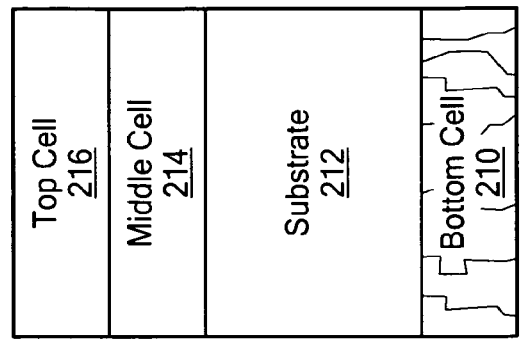
FIG. 3
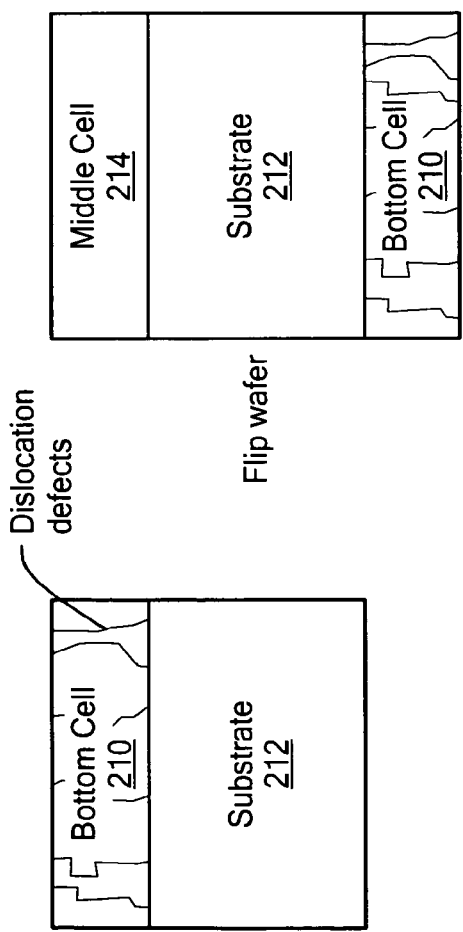
FIG. 2
FIG. 1

| Layer | Material | Thickness | Doping | Purpose |
|---|---|---|---|---|
| | | nm | cm-3 | |
| 1 | MgF2 or SiO2 | 130 | | Upper Antireflection Coating |
| 2 | ZnS or TiO2 | 66 | | Lower Antireflection Coating |
| 3 | Au or Ag | 5000 | | Front Grid Metal |
| 4 | Pt or Pd or Ni | 50 | | Diffusion Barrier |
| 5 | Ti or Cr | 20 | | Sticking Layer |
| 6 | n+GaAs | 60 | >1e19 | Contact Cap |
| 7 | n-GaAs | 200 | 2.0E+18 | Contact Spacer |
| 8 | n-InAlP | 20 | 4.0E+18 | Top Cell Window |
| 9 | n-InGaP | 30 | 4.0E+18 | Top Cell Emitter |
| 10 | p-InGap | 1200 | 3.0E+16 | Top Cel Base |
| 11 | p-In0.5(A10.3Ga0.7)0.5P | 100 | 1.2E+18 | Top Cell Back Surface Field |
| 12 | p+-Al0.4GaAs | 100 | 1.0E+20 | P Tunnel Junction Layer |
| 13 | GaAs | 1 | u/d | Doping Offset |
| 14 | 30 s flush | | | Vent Excess Dopant Gas |
| 15 | n+-GaAs | 30 | 1.4E+19 | N Tunnel Junction Layer |
| 16 | 30 s DeTe flush | | | Vent Excess Dopant Gas |
| 17 | n-A10.4GaAs | 30 | 1.0E+18 | Middle Cell Window |
| 18 | n-GaAs | 85 | 1.0E+18 | Middle Cell Emitter |
| 19 | p-GaAs | 3500 | 1.0E+17 | Middle Cell Base |
| 20 | p-A10.3GaAs | 250 | 1.0E+18 | Middle Cell Back Surface Field |
| 21 | p+-A10.4GaAs | 100 | 1.0E+20 | P Tunnel Junction Layer |
| 22 | GaAs | 1 | u/d | Doping Offset |
| 23 | 30 s flush | | | Vent Excess Dopant Gas |
| 24 | n+-GaAs | 30 | 1.4E+19 | N Tunnel Junction Layer |
| 25 | 30 s DeTe flush | | | Vent Excess Dopant Gas |
| 26 | n-GaAs buffer | 200 | 2.0E+18 | Growth Buffer |
| 27 | n-GaAs wafer | 0.3 to 0.6mm | 8.00E+16 | GaAs Substrate Wafer |
| 28 | n-GaAs buffer | 500 | 5.0E+17 | Growth Buffer |
| 29 | n-In0.03(A10.6Ga0.4)As | 250 | 5.0E+17 | Bottom Cell Grading Layer |
| 30 | n-In0.07(A10.6Ga0.4)As | 250 | 5.0E+17 | Bottom Cell Grading Layer |
| 31 | n-In0.10(A10.6Ga0.4)As | 250 | 5.0E+17 | Bottom Cell Grading Layer |
| 32 | n-In0.14(A10.6Ga0.4)As | 250 | 5.0E+17 | Bottom Cell Grading Layer |
| 33 | n-In0.17(A10.6Ga0.4)As | 250 | 5.0E+17 | Bottom Cell Grading Layer |
| 34 | n-In0.21(A10.6Ga0.4)As | 250 | 5.0E+17 | Bottom Cell Grading Layer |
| 35 | n-In0.24(A10.6Ga0.4)As | 250 | 5.0E+17 | Bottom Cell Grading Layer |
| 36 | n-In0.28(A10.6Ga0.4)As | 250 | 5.0E+17 | Bottom Cell Grading Layer |
| 37 | n-In0.31(A10.6Ga0.4)As | 250 | 5.0E+17 | Bottom Cell Grading Layer |
| 38 | n-In0.35(A10.6Ga0.4)As | 250 | 5.0E+17 | Bottom Cell Window |
| 39 | n-In0.35GaAs | 300 | 1.5E+18 | Bottom Cell Emitter |
| 40 | p-In0.35GaAs | 1700 | 6.0E+16 | Bottom Cell Base |
| 41 | p-In0.35(A10.6Ga0.4)As | 100 | 5.0E+17 | Bottom Cell Back Surface Field |
| 42 | p+-In0.35GaAs | 600 | 2.0E+19 | Bottom Cell Contact Layer |
| 43 | Cr or Ti | 30 | | Bottom Metal Contact Layer |
| 44 | Pt or Pd or Ni | 40 | | Diffusion Barrier Layer |
| 45 | Au or Ag | 1000 | | Bottom Metal Contact Layer |

*FIG. 4*

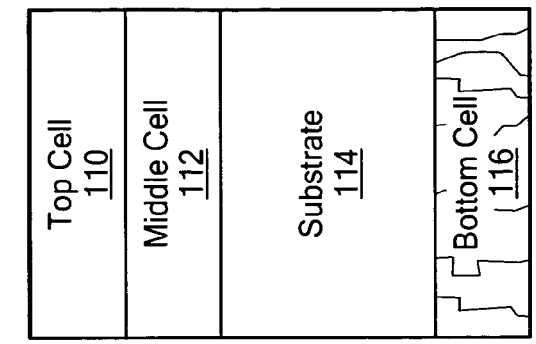
*FIG. 5*
*FIG. 6*
*FIG. 7*

BIFACIAL TANDEM SOLAR CELLS

REFERENCE TO RELATED APPLICATION

The present application is a continuation of U.S. patent application Ser. No. 12/800,824, filed May 24, 2010, entitled "METHOD OF FABRICATING BIFACIAL TANDEM SOLAR CELLS," the disclosure of which is incorporated herein by reference.

This invention was made with Government support under Subcontract No. NAT-9-88012-04 awarded by the United States Department of Energy. The Government has certain rights in the invention.

FIELD OF THE INVENTION

This invention relates to a method of fabricating on a semiconductor substrate bifacial tandem solar cells with a lower bandgap than the substrate bandgap on one side and with a higher bandgap than the substrate on the other.

BACKGROUND OF THE INVENTION

Tandem solar cells, also known as multijunction, cascade, or multi-bandgap solar cells, contain two or more subcells, with each subcell containing a PN junction designed to convert light into electrical power from a different part of the solar spectrum. Subcells are made from various semiconductor materials. In the final solar cell, the subcells are vertically stacked, in order, from the subcell with the highest bandgap in the uppermost position to the subcell with the lowest bandgap in the lowest position in the stack. The highest bandgap subcell receives the incident sunlight first, absorbing mostly short wavelength light, while its material allows longer wavelength light to pass through virtually unabsorbed. Each subsequent subcell in the tandem stack then absorbs some remaining light, passing on the longer wavelengths of the light. The purpose of these multiple subcells, each of a different bandgap, is to more efficiently utilize the solar spectrum and increase the solar to electrical power conversion efficiency compared to a single junction solar cell.

The semiconductor materials used for the substrate or support substrate and the various stacked subcells (e.g. top, middle, bottom cell in a three junction tandem cell) epitaxially grown on the substrate should have nearly the same (e.g. within a few thousand parts per million) semiconductor crystalline lattice constant (e.g. 5.65 angstroms for gallium arsenide based cells) to avoid crystal defects (e.g. dislocations) which may form to relieve the mechanical strain caused if there is lattice mismatch between subcells. These dislocation defects often act as minority carrier recombination sites, which degrade the power conversion efficiency of the solar cell. The choices of materials for the support substrate and the various component subcells (top, middle, etc.) of the tandem are thus limited to those closely lattice-matched with each other. Useful tandem cells, known as metamorphic cells, can be made despite the presence of significant lattice mismatch, if a greater benefit can be achieved (e.g. freedom to match bandgaps of subcells to maximize and equalize the electrical current generated in each subcell) than that given up by the introduction of the dislocations.

One approach to this problem is to use bifacial, tandem solar cells where the subcells can be placed on both sides of a substrate to isolate the effects of lattice mismatch to cells on one side of the substrate. U.S. Patent Publication US2006/0162768 A1, by Wanlass et al. covers the general case of a transparent semiconducting substrate with subcells grown on each side. In comparison with Wanlass, the inventions claimed here are related to particular non-obvious process sequences used to grow the subcells on each side of the substrate. In US 2005/0056312 A1, Young et al. describes subcells on opposite sides of an insulating glass substrate and in U.S. Pat. No. 4,289,920 Hovel describes subcells on opposite sides of an insulating ceramic substrate. Both of these patents, although describing a bi-facial growth, do not use epitaxial growth on a semiconducting substrate on which our particular invention claims are based.

Currently inverted metamorphic processes are being used to make high efficiency tandem solar cells but those processes involve substrate bonding and epitaxial lift-off which are lower yield when used over large substrate areas. "40.8% Efficient Inverted Triple-Junction Solar Cell With Two Independently Metamorphic Junctions" by J. F. Geisz et al., Applied Physics Letters 93, 123505 (2008).

SUMMARY OF THE INVENTION

In accordance with various aspects of the subject invention in at least one embodiment the invention presents an improved method of fabricating bifacial tandem solar cells with lower bandgap subcells on one side of the substrate and high bandgap subcells on the other which is easier, simpler and more reliable even over larger substrate areas than present inverted metamorphic processes currently used to fabricate similar tandem cells.

The subject invention results from the realization that, in part, an improved method of fabricating on a semiconductor substrate bifacial tandem solar cells with a lower bandgap than the substrate bandgap on one side and with a higher bandgap than the substrate on the other in various aspects can be achieved either by growing a lower bandgap subcell or subcells whose material composition is similar to the substrate and then flipping the substrate and growing higher bandgap subcells, or, by growing the higher bandgap subcells first on either a substrate whose backside has a protective film, or, if not, then etching the substrate surface before proceeding with lower bandgap subcell growths.

The subject invention, however, in other embodiments, need not achieve all these objectives and the claims hereof should not be limited to structures or methods capable of achieving these objectives.

This invention features a method of fabricating on a semiconductor substrate bifacial tandem solar cells with semiconductor subcells having a lower bandgap than the substrate bandgap on one side of the substrate and with subcells having a higher bandgap than the substrate on the other. First a lower bandgap subcell is grown on one substrate side that uses only the same periodic table group V material in the dislocation-reducing grading layers and bottom subcells as is present in the substrate and after the initial growth is complete then flipping the substrate and growing the higher bandgap subcells on the opposite substrate side which can be of different group V material.

In preferred embodiments after the lower bandgap subcells are grown, the lower bandgap subcell epilayers may be capped with a suitable protective layer before continuing on to the growth of higher bandgap subcells on the opposite substrate side. The protective layer may include silicon nitride. The substrate may be a lightly doped (less than $5 \times 10^{17}$ cm$^{-3}$ substrate)N-type GaAs or InP substrate. The grading layers maybe one of $In_x(Al_yGa_{1-y})_{1-x}$ P and $In_x(Al_yGa_{1-y})_{1-x}$As. The bottom subcells may be made of $In_xGa_{1-x}$As. The first higher bandgap subcell may include a N-on-P cell of $In_xGa_{1-x}$As or GaAs. The second higher bandgap subcell may be made of $In_xGa_{1-x}P$ or $In_x(Al_yGa_{1-y})_{1-x}P$. A bottom contact cap may include additional thickness so that a portion of the bottom cap can be etched away to remove any area damaged during epitaxial growth of the upper higher bandgap subcells.

The invention also features a method of fabricating on a semiconductor substrate bifacial tandem solar cells with subcells having a lower bandgap than the substrate bandgap on one side of the substrate and with subcells having a higher bandgap than the substrate on the other side made by first growing higher bandgap subcells that can have differing group V materials (e.g. GaAs middle and InGaP top cells) on one side of the GaAs substrate including applying a protective layer to the upper subcell epilayers, etching or polishing the back substrate surface to remove damaged substrate material, growing an epitaxial conditioning buffer of the same material as the substrate on the etched surface, and epitaxially growing the grading layers and at least one bottom subcell.

In preferred embodiments the substrate may be a lightly doped (less than $5\times10^{17}$ cm$^{-3}$ substrate)N-type GaAs or InP substrate. The grading layers may be one of $In_x(Al_yGa_{1-y})_{1-x}P$ and $In_x(Al_yGa_{1-y})_{1-x}As$. The bottom subcells may be made of $In_xGa_{1-x}As$. The first higher bandgap subcell may include a N-on-P cell of $In_xGa_{1-x}As$ or GaAs. The second higher bandgap subcell may be made of $In_xGa_{1-x}P$ or $In_x(Al_yGa_{1-y})_{1-x}P$.

This invention also features a method of fabricating on a semiconductor substrate bifacial tandem solar cells with subcells having a lower bandgap than the substrate bandgap on one side of the substrate and with subcells having a higher bandgap than the substrate on the other side made by first coating the substrate backside with a protective layer then growing higher bandgap subcells that can have differing group V materials on one side of the GaAs substrate including applying a protective layer if needed to the upper subcell epilayers, removing the protective film on the substrate backside, growing an epitaxial conditioning buffer of the same material, and then epitaxially growing the grading layers and at least one bottom subcell.

In preferred embodiments the substrate may be a lightly doped (less than $5\times10^{17}$ cm$^{-3}$ substrate)N-type GaAs or InP substrate. The grading layers may be one of $In_x(Al_yGa_{1-y})_{1-x}P$ and $In_x(Al_yGa_{1-y})_{1-x}As$. The bottom subcells may be made of $In_xGa_{1-x}As$. The first higher bandgap subcell may include a N-on-P cell of $In_xGa_{1-x}As$ or GaAs. The second higher bandgap subcell may be made of $In_xGa_{1-x}P$ or $In_x(Al_yGa_{1-y})_{1-x}P$.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 1 is a schematic diagram of a low bandgap tandem subcell grown on a higher bandgap conducting, transparent semiconductor substrate;

FIG. 2 illustrates the fabrication of the preferred embodiment of the bifacial tandem cell by showing a middle cell grown on the substrate side opposite the bottom cell following flipping the substrate after bottom cell epitaxial growth;

FIG. 3 shows the next step of the first preferred embodiment, in which a top cell, with a higher bandgap than any of the previous subcells, is finally grown;

FIG. 4 is a flow chart showing the steps and layers according to one detailed embodiment of the method and also may be viewed as a detailed cross-section schematic view of a solar cell made according to the invention;

FIG. 5 is a schematic diagram of a solar cell in accordance with another embodiment of the invention with a substrate having a middle and then top subcell grown on its front side;

FIG. 6 is a schematic diagram of the solar cell of FIG. 5 with the substrate flipped with the lower bandgap bottom subcell grown on the opposite side; and FIG. 7 is a schematic diagram of the tandem cell of FIG. 6 simply flipped again so the top cell receives incident light first.

DETAILED DESCRIPTION OF THE INVENTION

Aside from the preferred embodiment or embodiments disclosed below, this invention is capable of other embodiments and of being practiced or being carried out in various ways. In particular, the invention is applicable to either N-on-P or P-on-N tandem structures. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

It has been generally accepted by persons skilled in the art that the desired configuration for monolithic multijunction tandem devices is best achieved by lattice matching the material for all component subcells (e.g. top, middle, bottom, etc.) in the tandem cell to the substrate or substrate material. Mismatches in the lattice constants create dislocation defects in the crystal lattice which can act as minority-carrier recombination centers, causing the loss of photogenerated minority carriers and thus significantly degrading the photovoltaic efficiency of the device.

However, the common design rule that the materials used in the solar cell need to be lattice matched is not the only constraint on the tandem cell design. Another important constraint is that just the right amount of light be absorbed in each subcell so that the photocurrent generated in each subcell is very similar to all other subcells. This second current-matching constraint allows the subcells to be connected together in series internally by means of a tunnel junction between subcells, and allows the final user of the solar cell to only have to connect to two terminals, one at the top and one at the bottom of the cell. In order for the current in each series-connected subcell (e.g. top, middle, bottom, etc.) in the tandem structure to be the same (e.g. current-matched), only certain bandgap combinations can be used so that each cell absorbs just the right amount of light.

FIG. 1 is a schematic diagram of a low bandgap tandem subcell 210 grown on a higher bandgap conducting, transparent semiconductor substrate 212. In the preferred embodiment, this bottom subcell 210 will have an optimum bandgap which will likely not be lattice-matched to the substrate. Dislocation defects are created to relieve stress caused by the lattice mismatch between the atomic spacing of the subcell and substrate material. The invention will limit their influence to subcells on one side of the substrate.

FIG. 2 continues to illustrate the fabrication of the preferred embodiment of the bifacial tandem cell by showing a middle cell 214 grown on the substrate 212 side opposite the bottom cell 210 after the substrate is flipped at the epitaxial growth reactor. One important advantage of this embodiment is that no surface preparation is needed after the bottom subcell 210 growth to grow cells on this opposite side. This middle cell 214 has a higher bandgap than the substrate 212, which in turn has a higher bandgap than the bottom cell 210 to allow light to transit through the substrate to the bottom cell. An option in the process after the lower bandgap subcell 210 growth is to deposit a suitable (e.g. silicon nitride) protective layer that can survive the high temperature epigrowth and is thermally expansion matched to the substrate so that the contact cap of the bottom cells is not degraded during top cell growth.

FIG. 3 shows the final figure of the first preferred embodiment, in which a top cell 216, with a higher bandgap than any of the previous subcells or substrates, is finally grown.

One specific embodiment includes a three junction tandem cell suitable for one-sun or concentrator space or terrestrial cells, in which the lattice matched top and middle cells are grown on one side of the substrate and the lattice mismatched bottom cell is grown on the opposite side of the substrate as shown in FIG. 4.

The invention contemplates at least two approaches to creating the structure of FIG. 4. One is fabricating bifacial cells by first epitaxially growing a cell or cells with a lower bandgap than the substrate bandgap on one side of a semiconducting substrate, and then flipping the substrate, and growing one or more cells with a higher bandgap on the opposite side. The second is fabricating bifacial cells by first epitaxially growing a cell or cells with a higher bandgap than the substrate bandgap on one side of a semiconducting substrate, and then flipping the substrate and growing one or more cells with a lower bandgap on the opposite side. Both approaches use a number of standard processes/sequences but in the special order according to this invention.

The first and preferred approach includes growing subcell(s) with bandgaps lower than substrate on one side of the substrate, flipping the substrate and growing subcells with bandgaps equal to or higher than the substrate on the opposite side of the substrate.

Substrate 27, FIG. 4, is N-type and lightly doped (generally $<5 \times 10^{17}$ cm$^{-3}$) in order to limit free carrier absorption and allow almost all of the infrared light traveling through the substrate into the lower bandgap backside subcells. An embodiment with one backside subcell is shown in FIG. 4, layers 28-42. Substrates are generally polished on both front and back to present a smooth growth surface, although acceptable growths can be performed on just an etched but not polished backside surface.

Buffer layer 28, generally of the same material and doping type as the substrate, is first grown to "condition" the back surface of the substrate 27 and improve the quality of subsequent epilayer growth. Although inclusion of this layer is preferred, acceptable growth can occur if this layer is omitted, especially on a polished substrate 27 starting surface.

A series of epitaxial "grading" layers 29-37 are grown next, again of the same N doping type as the substrate. The initial grading layer 29 has a lattice constant near that of the substrate (e.g. 5.65 angstroms if a GaAs substrate). The final grading layer 37 has a different lattice-constant that is determined by the bandgap needed by the adjacent bottom subcell to achieve an acceptable matched photocurrent with the other planned subcells of the tandem. Each grading layer has an intermediate lattice constant between the initial and final values. In one embodiment, the linear step grade, the layers are made of equal thickness and each lattice constant (or equivalently each material composition) of the intermediate grading layers 29-37 are adjusted to have a uniform increment from the initial to the final value. Other types of grades with non-linear step thicknesses and compositions can be used.

In a preferred embodiment using an N-type GaAs substrate, materials used for the grading layer include $In_x(Al_yGa_{1-y})_{1-x}P$ and $In_x(Al_yGa_{1-y})_{1-x}As$. Compositions from materials such as these are preferred since the compositions of the grading layers can be adjusted to have a higher bandgap than the GaAs substrate, minimizing absorption loss of the light emerging from the substrate before the light reaches the lower bandgap cells.

$In_x(Al_yGa_{1-y})_{1-x}As$ is preferred over $In_x(Al_yGa_{1-y})_{1-x}P$ for grading layers when growing the bottom cells because the opposite side of the GaAs substrate (upper side of layer 27) is essentially undamaged during the growth of the InAlGaAs grading layers and bottom cell. After flipping the substrate, this upper surface is suitable for immediate growth of the upper higher bandgap subcells and tunnel junctions (layers 6-26, GaAs middle and InGaP top cells and tunnel junctions) as long as an arsine atmosphere was used for the bottom cell growth e.g. an $In_x(Al_yGa_{1-y})_{1-x}As$ grade and InGaAs subcell (layers 38-42). Use of any phosphorous (e.g. growth in a phosphine atmosphere such as for an $In_x(Al_yGa_{1-y})_{1-x}P$ grade) tends to damage the opposite GaAs substrate surface which will then require additional effort to prepare for the growth of the upper cells.

After growth of the buffer and grading layers 28-37, the bottom cell 38-41 is grown. Typical thicknesses, doping and compositions are shown for these window, emitter, base, and back surface field, layers 38-41, in FIG. 4, but variation is possible. The final cap layer 42 serves two purposes. Traditionally, this layer is heavily doped and of low bandgap to make a low resistance ohmic contact to the metal layers 43 to 45 on the backside of the substrate. In addition, this layer is thicker than normal (between 500 and 2000 nm). The purpose of the thick cap growth is to have enough material so that a portion of the cap layer can be etched away after growth during subsequent processing to remove a damaged layer of material that resulted when the InGaP top cell is grown on the opposite side of the substrate.

In one variation of this growth technique, as an alternative to the cap etch, the substrate is removed from the epitaxial reactor and the last layer grown (the cap) is protected with a 50-500 nm silicon nitride or other suitable protective film by plasma enhanced chemical vapor deposition or other deposition technique. The purpose of this temporary protective layer (it is removed during subsequent cell processing) is to prevent degradation of the bottom subcell surface during growth of the upper high bandgap InGaP based top subcells in a phosphine atmosphere. The protective film should be relatively dense to serve as a good diffusion barrier to phosphorous and dopant atoms and should be thermally expansion matched to the bottom subcell material.

After epigrowth of layers 28-42 and cooling, the substrate is flipped in the epitaxial reactor glovebox so that growth of the tunnel junctions and higher bandgap subcells layers 6-26 can proceed on the opposite substrate layer 27 side. A buffer layer 26 may be first grown on the flipped substrate surface to help condition the substrate for subsequent growth.

Next, the first tunnel junction, layers 21-25, is then grown using the N-on-P cell geometry with a low infrared light absorption N-type GaAs substrate. A Te dopant flush step 25 saturates the reactor lines and surfaces so that the Te is more readily incorporated into the growing film interface instead of being adsorbed elsewhere in the reactor during this growth step. In this first tunnel junction, a highly doped N GaAs layer 24 can be grown appreciably thicker than indicated in FIG. 4 since there is little light remaining at this point that the GaAs can absorb. The reactor is then flushed of the Te dopant gas 23 and a very thin undoped GaAs layer 22 is grown to help make an abrupt interface at a PN junction with a high bandgap transparent carbon-doped highly P-type AlGaAs layer (21) grown at low V-III ratio.

A standard N-on-P GaAs cell, layers 17-20, is grown. There are other possible variations of doping and thickness and composition of the window, emitter, base, and back surface field layers of this middle subcell. In general, the window of this subcell, layer 21, can be made to have a lower bandgap than a window in a stand-alone single-junction GaAs subcell since the upper InGaP subcell, layers 6-11, absorbs much of the higher energy photons. Advantages of a lower bandgap N-type AlGaAs window are slightly lower interface recombination due to slightly less mismatch and slightly lower series resistance due to a lower electron barrier at the interface.

The second tunnel junction, layers 12-16, is then grown using the N-on-P cell geometry. A Te dopant flush step 16 again saturates the reactor lines and surfaces. In this second tunnel junction, the highly doped N GaAs layer 15 must be grown as thin as possible since it absorbs some light that the underlying GaAs middle subcell 17-20 can absorb. The reactor is then again flushed of the Te dopant gas 14 and a very thin undoped GaAs layer 13 is grown to help make an abrupt interface at a PN junction with a high bandgap transparent carbon-doped highly P-type AlGaAs layer 12 grown at low V-III ratio.

An advantage of this bottom-subcell-first growth approach is that both tunnel junctions on the front side, whose performance (series resistance and peak current) is sensitive to dopant diffusion, experience less dopant diffusion than in the alternative top-subcell first growth approach to be described later since the tunnel junctions are not subject to additional high temperature annealing from the bottom subcell growth.

A standard N-on-P InGaP or InAlGaP cell, layers 6-11 is grown. There are many possible variations of doping and thickness and composition of the window, emitter, base, and back surface field layers of this upper top subcell. Of particular note, when using Te dopant for the N GaAs cap layer 6, including a dopant spacer layer 7 with a lower doping level of silicon, improves the cell open-circuit voltage and photocurrent collection from the emitter layer 9. The InAlP window 8 serves as both a minority carrier mirror and a selective wet etch stop to remove the GaAs cap layers 6-7 that are not under a metal gridline 3-5.

Substrate processing for the these cells proceeds as follows. If the optional silicon nitride protection layer was used, it is etched away in buffered HF acid. The substrate front side (upper and middle subcells) are protected with photoresist. Bottom cap 42 can be made additionally thick so that about half the bottom cap 42 is removed in a timed etch to remove most of the material damaged by exposure to phosphine during the top subcell growth. The bottom metal contact stack 43-45 is evaporated over the full area of the back subcell surface. Holes in photoresist for metal gridlines are photolithographically patterned and the top metal stack 3-5 is evaporated and then defined by a metal liftoff process. Mesas are then photolithographically patterned to protect the cell area and a wet etch removes excess material down to the substrate. The metal on the substrate backside protects the back epi during this etch. This mesa step may be unnecessary. There seems to be little performance degradation in a concentrator solar cell application if it is cut directly through the upper epi versus in a street around the cell periphery. The top cap is selectively etched using the metal gridlines as a self-aligned mask and the InAlP window as an etch stop for a citric acid-based wet etch. Finally, an AR coating 1-2 is then deposited on the cells immediately after the cap etch to minimize oxidation of the InAlP window in air. Openings are photolithographically made over the contact area busbars. The substrates are then diced into individual cells.

The second approach includes growing subcells with bandgaps equal to or higher than the substrate on one side of substrate, flipping the substrate, and growing subcells with bandgaps lower than substrate on the opposite side of the substrate.

Substrate layer 27 is N-type and lightly doped (generally $<5 \times 10^{17}$ cm$^{-3}$) in order to limit free carrier absorption and allow almost all of the infrared light traveling through the substrate into the lower bandgap backside subcells: an embodiment with one backside subcell is shown in FIG. 4, layers 28-42. Substrates are generally polished on both front and back to present a smooth growth surface, although acceptable growths can be performed on just an etched but unpolished backside surface.

In one variation of this growth technique, before bringing substrates to the epitaxial reactor, the backside substrate surface is protected with a 50-500 nm silicon nitride or other suitable protective film by plasma enhanced chemical vapor deposition or other deposition technique. The purpose of this temporary protective layer (it is removed during subsequent processing) is to prevent degradation of the back GaAs substrate surface during growth of the upper high bandgap InGaP based top subcells in a phosphine atmosphere. The protective film should be relatively dense to serve as a good diffusion barrier to phosphorous and dopant atoms and should be thermally expansion matched to the bottom subcell material. A buffer layer 26 is first grown on the substrate surface to help condition the substrate for subsequent growth.

The first tunnel junction, layers 21-25 is then grown using the N-on-P cell geometry with a low infrared light absorption N-type GaAs substrate. A Te dopant flush step 25 saturates the reactor lines and surfaces so that the Te is more readily incorporated into the growing film interface instead of being adsorbed elsewhere in the reactor during this growth step. In this first tunnel junction, a highly doped N GaAs layer (24) can be grown appreciably thicker than indicated in FIG. 4 since there is little light remaining at this point that the GaAs can absorb. The reactor is then flushed of the Te dopant gas 23 and a very thin undoped GaAs layer 22 is grown to help make an abrupt interface at a PN junction with a high bandgap transparent carbon-doped highly P-type AlGaAs layer 21 grown at low ratio.

A standard N-on-P GaAs subcell (layers 17-20) is grown. There are many possible variations of doping and thickness and composition of the window, emitter, base, and back surface field layers of this middle subcell. In general, the window of this subcell layer 21 can be made to have a lower bandgap than a window in a stand-alone single-junction GaAs cell since the upper InGaP subcell, layers 6-11 absorbs much of the higher energy photons. Advantages of a lower bandgap N-type AlGaAs window are slightly lower interface recombination due to slightly less mismatch and slightly lower series resistance due to a lower electron barrier at the interface.

The second tunnel junction, layers 12-16 is then grown using the N-on-P cell geometry. A Te dopant flush step 16 again saturates the reactor lines and surfaces. In this second tunnel junction, the highly doped N GaAs layer 15 must be grown as thin as possible since it absorbs some light that the underlying GaAs middle subcell 17-20 can absorb. The reactor is then flushed of the Te dopant gas 14 and a very thin undoped GaAs layer 13 is grown to help make an abrupt interface at a PN junction with a high bandgap transparent carbon-doped highly P-type AlGaAs layer 12 grown at low V-III ratio.

A standard N-on-P InGaP or InAlGaP subcell, layers 6-11 is grown. There are other possible variations of doping and thickness and composition of the window, emitter, base, and back surface field layers of this upper top subcell. When using Te dopant for the N GaAs cap layer 6, including a dopant spacer layer 7 with a lower doping level of silicon, the cell open-circuit voltage and photocurrent collection from the emitter layer 9 is improved. The InAlP window 8 serves as both a minority carrier mirror and a selective wet etch stop to remove the GaAs cap layers 6-7 that are not under a metal gridline 3-5.

If the optional silicon nitride protection layer was used on the GaAs substrate back surface, it is now etched away in buffered HF acid after the front side epitaxial growth. If the SiN was not used, the backside GaAs substrate surface is contaminated with a residue from the InGaP subcell growth. The front side of the substrate is now protected with resist and a phosphoric acid based etch is used to remove 8-12 um of GaAs substrate material, leaving a rough etched surface. A buffer layer 28, generally of the same material and doping type as the substrate, is first grown to "condition" the back surface of the substrate 27 and improve the quality of subsequent epilayer growth. Thicker buffer layers of 500 nm of more are important to condition the back substrate for subsequent growth on rough surfaces.

A series of epitaxial "grading" layers are next grown, of the same N doping type as the substrate. The initial grading layer 29 has a lattice constant near that of the substrate e.g. 5.65 angstroms if a GaAs substrate. The final grading layer 37 has a different lattice-constant that is determined by the bandgap needed by the bottom cell to achieve an acceptable matched photocurrent with the other planned subcells of the tandem. Each grading layer has an intermediate lattice constant between the initial and final values. In one embodiment, the linear step grade, the layers are made of equal thickness and each lattice constant (or equivalently each material composition) of the intermediate grading layers 29-37 are adjusted to have a constant increment from the initial to the final value. Other types of grades with non-linear step thicknesses and compositions can be used.

In a preferred embodiment using an N-type GaAs substrate, materials used for the grading layer include $In_x(Al_yGa_{1-y})_{1-x}P$ and $In_x(Al_yGa_{1-y})_{1-x}As$. Compositions from materials such as these are preferred since the compositions of the grading layers can be adjusted to have a higher bandgap than the GaAs substrate, minimizing absorption loss of the light emerging from the substrate before the light reaches the lower bandgap subcells.

$In_x(Al_yGa_{1-y})_{1-x}As$ is preferred versus $In_x(Al_yGa_{1-y})_{1-x}P$ for grading layers when growing the bottom subcells because the topmost epilayers of the upper subcell should be essentially undamaged during the bottom subcell growth as long as an arsine atmosphere was used for the bottom subcell growth e.g. an $In_x(Al_yGa_{1-y})_{1-x}As$ grade and InGaAs layers 38-42. Use of any phosphorous e.g. growth in a phosphine atmosphere such as for an $In_x(Al_yGa_{1-y})_{1-x}P$ grade, would damage the upper epilayers of the topmost subcell on the other side of the substrate. If such a grade is used, additional protection e.g. a SiN protective layer or a thick cap, may be used on the top cell cap layers 6 and 7 in FIG. 4.

After growth of the buffer and grading layers 28-37, the bottom subcell is grown, layers 38-41. Typical thicknesses, dopings and compositions are shown for these window, emitter, base, and back surface field and cap layers 38-42 in FIG. 4, but variation is possible. The final cap layer 42 no longer serves two purposes and exists solely to make a low resistance ohmic contact to the metal, layers 43 to 45, on the backside of the substrate.

Substrate processing for these cells proceeds as follows. The substrate front side (upper and middle subcells) are protected with photoresist. The bottom metal contact stack 43-45 is evaporated over the full area of the back subcell surface. Holes in photoresist for metal gridlines are photolithographically patterned and the top metal stack 3-5 is evaporated and then defined by a metal liftoff process. Mesas are then photolithographically patterned to protect the subcell area and a wet etch removes excess material down to the substrate. The metal on the substrate backside protects the back epi during this etch. This mesa step may be unnecessary. There seems to be little performance degradation in a concentrator solar cell application if cut directly through the upper epi versus in a street around the subcell periphery. The top cap is selectively etched using the metal gridlines as a self-aligned mask and the InAlP window as an etch stop for a citric acid-based wet etch. An AR coating 1-2 is then deposited on the cells immediately after the cap etch to minimize oxidation of the InAlP window in air. Openings are photolithographically made over the contact area busbars. The substrate is then diced into individual cells.

In this approach substrate bowing issues are greatly reduced. There is no substrate bowing during growth of the upper InGaP based and GaAs based subcells on the GaAs substrate. Bowing from the strain of the ~2% lattice mismatched bottom subcells is reduced if the cells do not need to be thermally cycled back up to cell growth temperatures. Thinner substrates (less infrared transmission loss) can be used. In addition, the bottom cell is not degraded after it is grown by the InGaP based top cell growth. With the bottom-subcell-last growth approach the substrates need to be removed from the reactor area after top subcell growth to either remove a SiN protection layer or to wet etch the back surface to remove top subcell growth residue. Bottom cells grown on etched surfaces may have slightly less performance than those grown on polished surfaces. However, the difference is small. Tunnel junctions on the front side will see additional 2 hours of annealing at the bottom subcell growth temperature, roughly 600 C. Although this may degrade by a factor of two or so in peak current and resistance, the performance is still acceptable. The GaAs top subcell cap layer doping is lowered due to additional diffusion during the bottom subcell growth, resulting in somewhat higher contact resistance if non-alloyed contacts are used. Traditional alloyed AuGeNi-based contacts which depend less on tunneling may be used. Bottom and top have been used to simplify explanation but it not limiting of the concept.

A more schematic view of this second approach is shown in FIGS. 5-7. One important advantage provided by the subject invention is that, for example, if two subcells 110 and 112, FIG. 5 such as In(49%)Ga(51%)P and GaAs are epitaxially grown lattice-matched and current-matched on one side of substrate 114, the substrate can be flipped, FIG. 6, and an additional subcell 116 (one or more) can be grown on the opposite side of the substrate in which the tandem cell designer can weigh the benefit of using material (e.g. compositions of InGaAs) in which the lattice constant is mismatched and dislocations are generated (dislocations depicted as jagged lines in the bottom cell) but the subcell bandgap and therefore subcell quantum efficiency and photocurrent are quite adjustable.

The thick substrate prevents the dislocations from propagating into the middle and top cells, as they would in standard metamorphic growths. The photocurrent may be easily matched and should lead to a net efficiency gain due to the extra voltage added by the bottom cell despite the presence of the dislocations. The dislocations do degrade the bottom cell photovoltage, but the idea is to limit this degradation to bottom cell 16, FIG. 7 and not allow the dislocations to degrade other subcells on the opposite side of the substrate.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

The invention claimed is:

1. A semiconductor device comprising:
a substrate having a first side and a second side opposite from the first side;
a lower bandgap subcell on the first side of the substrate, the lower bandgap subcell comprising a bottom subcell and grading layers, the bottom subcell and the grading layers comprising non-phosphorous materials and a first periodic table group V material;
a plurality of higher bandgap subcells on the second side of the substrate, the plurality of higher bandgap subcells comprising a second periodic table group V material; and
a protective layer on the lower bandgap subcell, the protective layer serving as a diffusion barrier to phosphorous and dopant atoms and being thermally expansion matched to the lower bandgap subcell,
wherein the lower bandgap subcell has a lower bandgap than a bandgap of the substrate, and the plurality of higher bandgap subcells have higher bandgaps than the bandgap of the substrate.

2. The semiconductor device of claim 1, wherein the substrate comprises a doped N-type GaAs substrate having a doping impurity concentration of less than $5 \times 10^{17}$ cm$^{-3}$.

3. The semiconductor device of claim 1, wherein the grading layers comprise $In_x(Al_yGa_{1-y})_{1-x}As$.

4. The semiconductor device of claim 1, wherein the bottom subcell comprises $In_xGa_{1-x}As$.

5. The semiconductor device of claim 1, wherein the plurality of higher bandgap subcells comprise a first higher bandgap subcell, the first higher bandgap subcell comprising a N-on-P cell, the N-on-P cell comprising $In_xGa_{1-x}As$ or GaAs.

6. The semiconductor device of claim 5, wherein the plurality of higher bandgap subcells comprise a second higher bandgap subcell, the second higher bandgap subcell comprising $In_xGa_{1-x}P$ or $In_x(Al_yGa_{1-y})_{1-x}P$.

7. The semiconductor device of claim 1, wherein the first periodic table group V material comprises a periodic table group V material of the substrate.

8. The semiconductor device of claim 1, wherein the first periodic table group V material comprises the same periodic table group V material as the second periodic table group V material.

9. The semiconductor device of claim 1, wherein the first periodic table group V material comprises a different periodic table group V material than the second periodic table group V material.

10. The semiconductor device of claim 1, wherein the lower bandgap subcell is not lattice-matched to the substrate, and the plurality of higher bandgap subcells are lattice-matched to the substrate.

11. The semiconductor device of claim 1, wherein a first higher bandgap subcell of the plurality of higher bandgap subcells has a different bandgap than a second higher bandgap subcell of the plurality of higher bandgap subcells.

12. The semiconductor device of claim 1, in combination with an epitaxial reactor glovebox configured to flip the substrate before growth of one of the lower bandgap subcell and the plurality of higher bandgap subcells on the substrate and after growth of one of the lower bandgap subcell and the plurality of higher bandgap subcells on the substrate.

13. The semiconductor device of claim 1, wherein the protective layer has a thickness between 50 nm and 500 nm.

14. The semiconductor device of claim 13, wherein the thickness of the protective layer is 50 nm.

15. The semiconductor device of claim 13, wherein the thickness of the protective layer is 500 nm.

16. The semiconductor device of claim 13, wherein the protective layer comprises silicon nitride.

* * * * *